United States Patent
Chang et al.

(10) Patent No.: US 10,460,939 B1
(45) Date of Patent: Oct. 29, 2019

(54) PATTERNING METHOD

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Hsin-Yu Chiang, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/975,730

(22) Filed: May 9, 2018

(30) Foreign Application Priority Data

Apr. 17, 2018 (CN) .......................... 2018 1 0342023

(51) Int. Cl.
*H01L 21/311* (2006.01)
*H01L 21/033* (2006.01)

(52) U.S. Cl.
CPC .... *H01L 21/0337* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 6,867,116 B1 * | 3/2005 | Chung | H01L 21/0337 257/E21.038 |
| 8,343,871 B2 | 1/2013 | Shih | |
| 2005/0272259 A1 * | 12/2005 | Hong | H01L 21/0337 438/669 |
| 2010/0029081 A1 * | 2/2010 | Wells | H01L 21/0337 438/694 |
| 2013/0344702 A1 * | 12/2013 | Nishizuka | H01L 21/31116 438/724 |
| 2015/0064906 A1 * | 3/2015 | Sel | H01L 21/0337 438/694 |
| 2017/0162380 A1 * | 6/2017 | Cheng | H01L 21/0271 |

OTHER PUBLICATIONS

Oxidation Behaviour of Silicon Carbide—A Review, Reviews on advanced materials science 38 (2014) 29-39, Dec. 30, 2014.
Doping Dependence of Thermal Oxidation on n-type 4H—SiC, IEEE Transactions on Electron Devices (vol. 58), Nov. 18, 2010.

* cited by examiner

*Primary Examiner* — Angel Roman
(74) *Attorney, Agent, or Firm* — Winston Hsu (57) ABSTRACT

A patterning method includes the following steps. A second mask layer is formed on a first mask layer. A patterning process is performed to the first mask layer and the second mask layer. The first mask layer is patterned to be a first mask pattern, and the second mask layer is patterned to be a second mask pattern formed on the first mask pattern. A first trim process is performed to the second mask pattern. A width of the second mask pattern is smaller than a width of the first mask pattern after the first trim process. A cover layer is formed covering the first mask pattern and the second mask pattern after the first trim process, and an etching process is performed to the first mask pattern after the step of forming the cover layer.

17 Claims, 6 Drawing Sheets

PATTERNING METHOD

BACKGROUND OF THE INVENTION

1. Field of the Invention

The present invention relates to a patterning method, and more particularly, to a patterning method including a trim process.

2. Description of the Prior Art

The integrated circuit (IC) is constructed by devices and interconnections, which are formed by patterned feature in a substrate or in different layers. In the fabrication of IC, photolithography process has been an essential technique. The photolithography process is applied to form designed patterns such as layout patterns on one or more photomask, and then to transfer such patterns to a photoresist layer on a film by exposure and development steps for precisely transferring the complicated layout pattern to a semiconductor chip.

Along with miniaturization of semiconductor devices and progress in fabrication of semiconductor device, the conventional lithography process meets the bottleneck and the limitation. Therefore, the double patterning technique (DPT) is developed for manufacturing semiconductor devices with a further smaller dimension. Generally, the double patterning technique includes a litho-etch-litho-etch (LELE) double patterning approach, a litho-freeze-litho-etch (LFLE) double patterning approach, and a self-aligned double patterning (SADP) approach. In the conventional SADP approach, a spacer is formed on sidewalls of a feature formed by a photo-etching process, the feature is then removed, and the pattern of the spacer is then transferred to a material layer underneath the spacer for forming a pattern with a smaller critical dimension. However, the layout pattern cannot be ideally transferred because there are still many manufacturing issues in the conventional SADP approach, such as the uniformity of etching recessing loading and spacer bending issue. The manufacturing yield and the operation performance of the device formed by the conventional SADP approach are influenced accordingly.

SUMMARY OF THE INVENTION

A patterning method is provided in the present invention. A first mask layer and a second mask layer are patterned concurrently for becoming a first mask pattern and a second mask pattern respectively. A first trim process is performed to the second mask pattern so that a width of the second mask pattern becomes smaller than a width of the first mask pattern. The second mask pattern with the smaller width may be formed self-aligned on the first mask pattern, and the second mask pattern may be used to form a pattern with a critical dimension (CD) smaller than the first mask pattern. The multiple patterning effect may be realized accordingly.

According to an embodiment of the present invention, a patterning method is provided. The patterning method includes the following steps. A second mask layer is formed on a first mask layer. A patterning process is performed to the first mask layer and the second mask layer. The first mask layer is patterned to be a first mask pattern, and the second mask layer is patterned to be a second mask pattern formed on the first mask pattern. A first trim process is performed to the second mask pattern. A width of the second mask pattern is smaller than a width of the first mask pattern after the first trim process. A cover layer is formed covering the first mask pattern and the second mask pattern after the first trim process. An etching process is performed to the first mask pattern after the step of forming the cover layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-10 are schematic drawings illustrating a patterning method according to a first embodiment of the present invention, wherein

DETAILED DESCRIPTION

Figure 1:
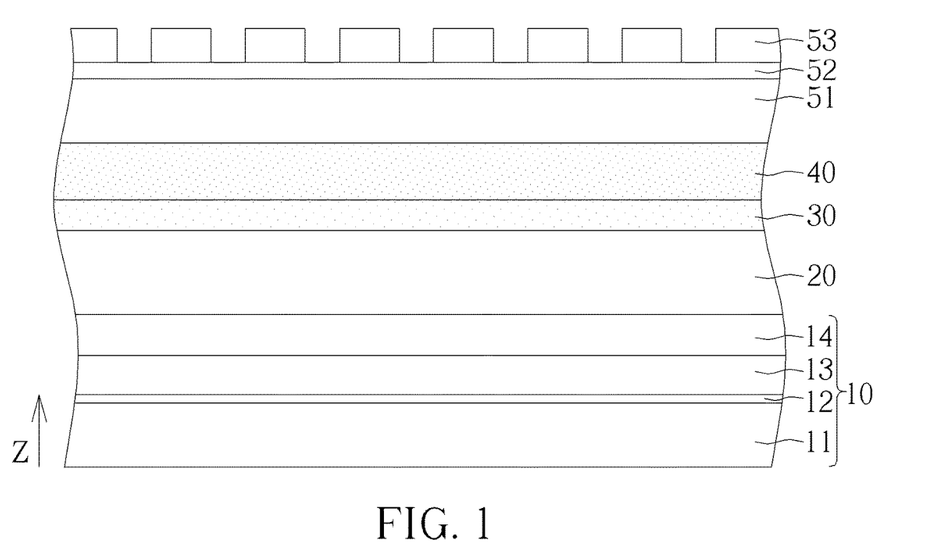

Please refer to FIGS. 1-10. FIGS. 1-10 are schematic drawings illustrating a patterning method according to a first embodiment of the present invention. The patterning method in this embodiment may include the following steps. As shown in FIG. 1, a second mask layer 40 is formed on a first mask layer 30. The material of the second mask layer 40 is different from the material of the first mask layer 30. For example, the second mask layer 40 may include a nitrogen doped silicon carbide layer, and the first mask layer 30 may be a silicon layer, but not limited thereto. In some embodiments, the second mask layer 40 and the first mask layer 30 may include other materials capable of having different treated effects required in the subsequent trim process and/or the required etching selectivity in the subsequent etching process.

Additionally, in some embodiments, the first mask layer 30 may be formed on a material layer 10, and a cap layer 20 may be optionally formed between the first mask layer 30 and the material layer 10. The material layer 10 and/or the cap layer 20 may be the etching target layer in the patterning method, but not limited thereto. For example, the material layer 10 may be a structure composed of a single layer or multiple layers of conductive material and/or dielectric material layers. For instance, the material layer 10 may include a substrate 11, a dielectric layer 12, a first conductive layer 13, and a second conductive layer 14 sequentially stacked in a thickness direction Z. In some embodiments, the substrate 11 may include a semiconductor substrate such as a silicon substrate, an epitaxial silicon substrate, a silicon germanium substrate, a silicon carbide substrate, or a silicon-on-insulator (SOI) substrate, but not limited thereto. The dielectric layer 12 may include silicon oxide or other suitable dielectric materials. The first conductive layer 13 may include a non-metal conductive material such as polysilicon and amorphous silicon, or other suitable conductive materials. The second conductive layer 14 may include a metal material such as aluminum, tungsten, copper, titanium aluminide, or other suitable conductive materials. The cap layer 20 may include silicon nitride or other suitable insulation materials.

Figure 2:
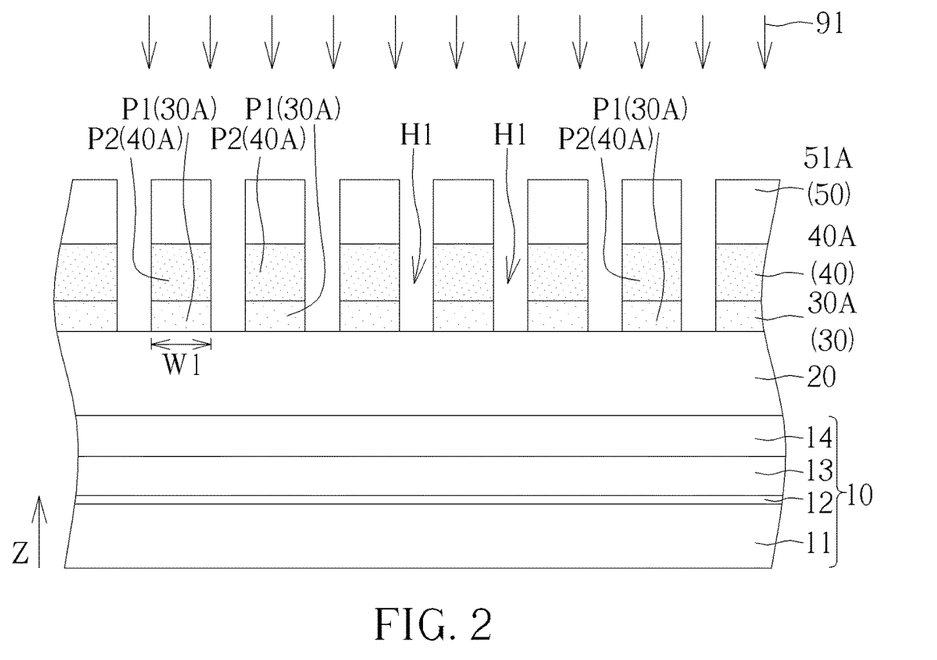
FIG. 2 is a schematic drawing in a step subsequent to FIG. 1.

As shown in FIG. 1 and FIG. 2, a patterning process 91 is performed to the first mask layer 30 and the second mask layer 40. The first mask layer 30 is patterned to be a first mask pattern 30A by the patterning process 91, and the second mask layer 40 is patterned to be a second mask pattern 40A by the patterning process 91. In other words, the first mask layer 30 and the second mask layer 40 are patterned by the patterning process 91 concurrently, and the second mask pattern 40A is formed on the first mask pattern 30A accordingly. The projection pattern of the second mask pattern 40A in the thickness direction Z of the material layer 10 may be substantially the same as the projection pattern of the first mask pattern 30A in the thickness direction Z of the material layer 10, but not limited thereto. Therefore, the critical dimension (CD) of the second mask pattern 40A formed by the patterning process 91 may be substantially equal to the CD of the first mask pattern 30A formed by the patterning process 91, and the width of the second mask pattern 40A may be equal to the width of the first mask pattern 30A (such as a first width W1 shown in FIG. 2).

In some embodiments, the patterning process 91 may include forming an organic dielectric layer 51, an anti-reflection layer 52, and a patterned photoresist layer 53 sequentially on the second mask layer 40 and performing one or more etching steps for forming the first mask pattern 30A and the second mask pattern 40A. The organic dielectric layer 51 may include an organic distribution layer (ODL), and the anti-reflection layer 52 may include a silicon-containing hard mask bottom anti-reflecting coating (SHB), but not limited thereto. A plurality of first openings H1 penetrating the organic dielectric layer 51, the second mask layer 40, and the first mask layer 30 may be formed by the patterning process 91 for defining the first mask pattern 30A, the second mask pattern 40A, and a patterned organic dielectric layer 51A overlapping with one another in the thickness direction Z, and the patterned organic dielectric layer 51A may be removed after the patterning process 91.

In some embodiments, the first mask pattern 30A may include a plurality of first sub patterns P1 separated from one another, and the second mask pattern 40A may include a plurality of second sub patterns P2 separated from one another. The second sub patterns P2 and the first sub patterns P1 may overlap one another in the thickness direction Z, and the width of each of the second sub patterns P2 may be substantially equal to the width of each of the first sub patterns P1 (such as the first width W1 described above).

Figure 3:
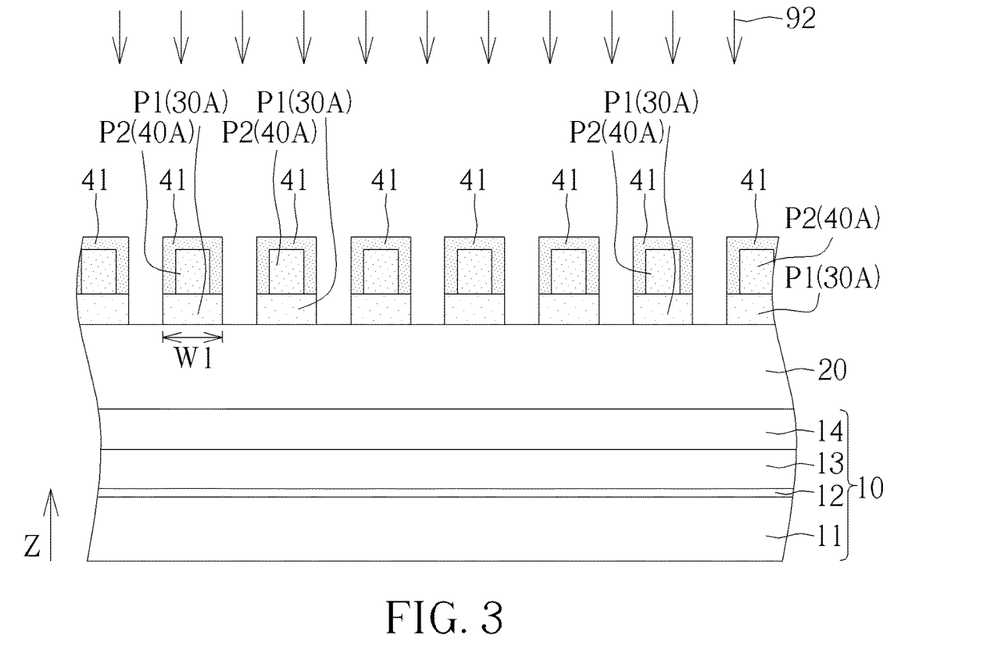
FIG. 3 is a schematic drawing in a step subsequent to FIG. 2.
Figure 4:
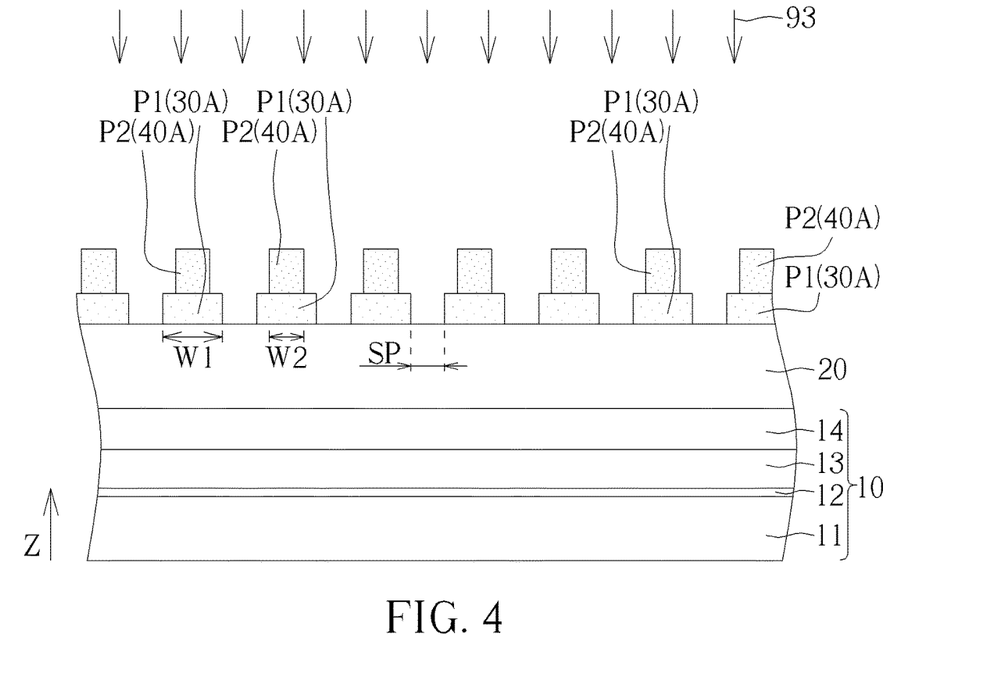
FIG. 4 is a schematic drawing in a step subsequent to FIG. 3.

Subsequently, a first trim process may be performed to the second mask pattern 40A, and a width of the second mask pattern 40A may be smaller than a width of the first mask pattern 30A after the first trim process. In some embodiments, the first trim process may include but is not limited to the following steps. As shown in FIG. 3 and FIG. 4, a plasma treatment 92 may performed to the second mask pattern 40A. A part of the second mask pattern 40A is converted into a treated layer 41 by the plasma treatment 92, and the treated layer 41 may encompass the second mask pattern 40A. A removing process 93 may be performed after the plasma treatment 92 for removing the treated layer 41, and the width of the second mask pattern 40A (such as a second width W2 shown in FIG. 4) is smaller than the width of the first mask pattern 30A (such as the first width W1 shown in FIG. 4) after the step of removing the treated layer 41. In other words, the first trim process may include the plasma treatment 92 and the removing process 93 configured to remove the treated layer after the plasma treatment 92, but the present invention is not limited to this. In some embodiments, the first trim process may include other suitable approaches for reducing the width of the second mask pattern 40A.

In some embodiments, the plasma treatment 92 may include an oxidation treatment, a hydrogenation treatment, or other suitable types of plasma treatments, and a part of the second mask pattern 40A may be oxidized or hydrogenated by the plasma treatment 92 to be the treated layer 41. Therefore, the treated layer 41 may include an oxide layer, a hydrogenated layer, or other material layers different from the composition of the second mask pattern 40A. Therefore, the removing process 93 configured to remove the treated layer 41 may be modified depending on the type of the plasma treatment 92 and the material condition of the treated layer 41. For instance, the removing process 93 may include an oxide removing process such as a dilute hydrofluoric acid (DHF) clean when the treated layer is an oxide layer, but not limited thereto.

In some embodiments, the treated layer 41 may be formed by consuming a part of each of the second sub patterns P2 in the plasma treatment 92, and the width of each of the second sub patterns P2 may be smaller than the width of each of the first sub patterns P1 after the plasma treatment 92 accordingly. Therefore, the width of the second mask pattern 40A may be substantially equal to the width of the first mask pattern 30A before the plasma treatment, and the width of the second mask pattern 40A after the plasma treatment 92 may be smaller than the width of the second mask pattern 40A before the plasma treatment 92. In other words, the width of the second mask pattern 40A may be substantially equal to the width of the first mask pattern 30A before the first trim process, and the width of the second mask pattern 40A after the first trim process may be smaller than the width of the second mask pattern 40A before the first trim process.

It is worth noting that the required thickness of the treated layer 41 may be obtained and the oxidized or hydrogenated degree of the first mask patterned 30A in the plasma treatment 92 may be lowered by modifying the process condition of the plasma treatment 92 and the material difference between the second mask pattern 40A and the first mask pattern 30A. For example, when the plasma treatment 92 is an oxidation treatment, the oxidation treatment may be a thermal oxidation treatment or other suitable oxidation approaches, and the process temperature of the oxidation treatment may be higher than or equal to 250° C. for forming the required treated layer 41. Additionally, an oxygen pressure used in the oxidation treatment may be higher than or equal to 1 bar for avoiding that the material formed by oxidizing the second mask pattern 40 is evaporated directly and the consumption rate of the second mask pattern 40 is too high and out of control when the oxygen pressure used in the oxidation treatment is too low, but not limited thereto. Additionally, when the material of the second mask pattern 40A is nitrogen doped silicon carbide, the nitride doped in the silicon carbide may be used to generate lattice mismatch and enhance the effect of being oxidized, and other components in the nitrogen doped silicon carbide may be modified for generating the required effect of being oxidized. For instance, the carbon concentration in the nitrogen doped silicon carbide may be higher than or equal to 40%, but not limited thereto.

By the manufacturing method described above, the plasma treatment 92 is performed to the second mask pattern 40A after the step of forming the first mask pattern 30A and the second mask pattern 40A so that the CD of the second mask pattern 40A may be smaller than the CS of the first mask pattern 30A. The second mask pattern 40A with smaller CD may be formed on the first mask pattern 30A by a self-aligned approach, and the second mask pattern 40A with smaller CD may be used for further patterning the first mask pattern 30 and forming features with further smaller CD. The purpose of multiple patterning may be achieved accordingly.

Figure 5:
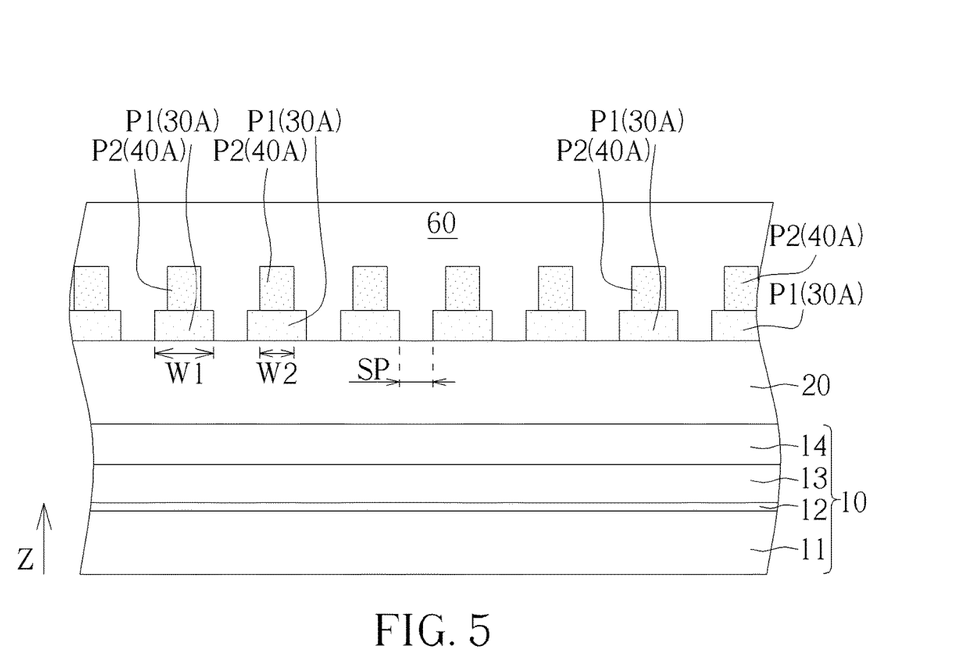
FIG. 5 is a schematic drawing in a step subsequent to FIG. 4.

For example, as shown in FIGS. 3-5, a cover layer 60 may be formed covering the first mask pattern 30A and the second mask pattern 40A after the first trim process described above. In some embodiments, the cover layer 60 may include a planarization layer, and the space in the second mask pattern 40A and the first mask pattern 30A may be filled with the cover layer 60. In other words, the space between the first sub patterns P1 adjacent to one another and the space between the second sub patterns P2 adjacent to one another may be filled with the cover layer 60, and the top surface of the cover layer 60 may be higher than the topmost surface of each of the second sub patterns P2 in the thickness direction Z. The material of the cover layer 60 may be different from the material of the first mask pattern 30A and the material of the second mask pattern 40A. For example, the cover layer 60 may include an organic distribution layer or other suitable materials having higher etching selectivity to the first mask pattern 30A and the second mask pattern 40A.

Figure 6:
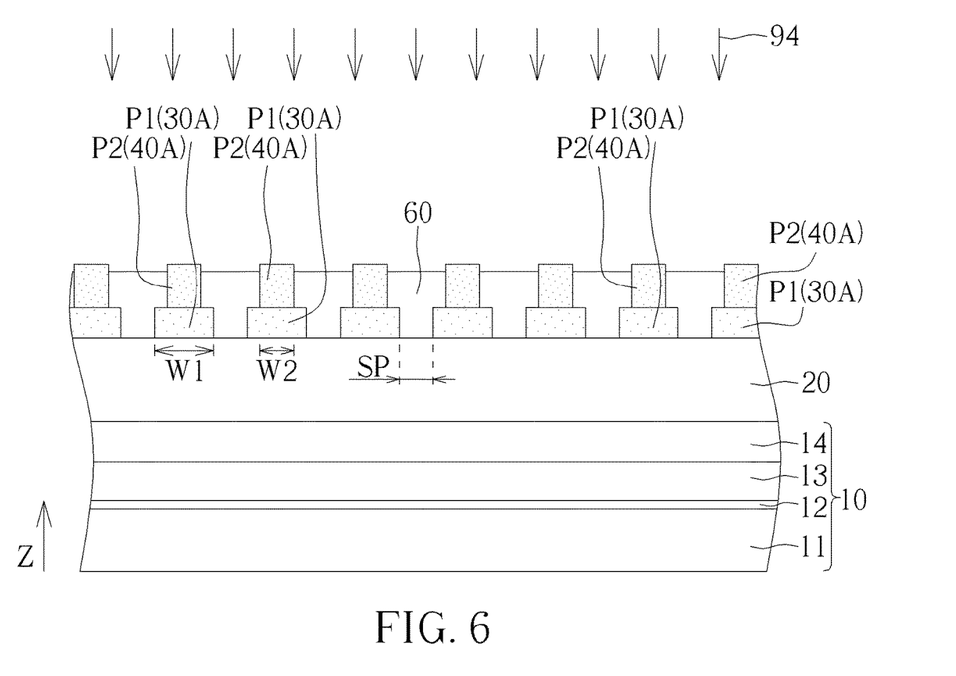
FIG. 6 is a schematic drawing in a step subsequent to FIG. 5.
Figure 7:
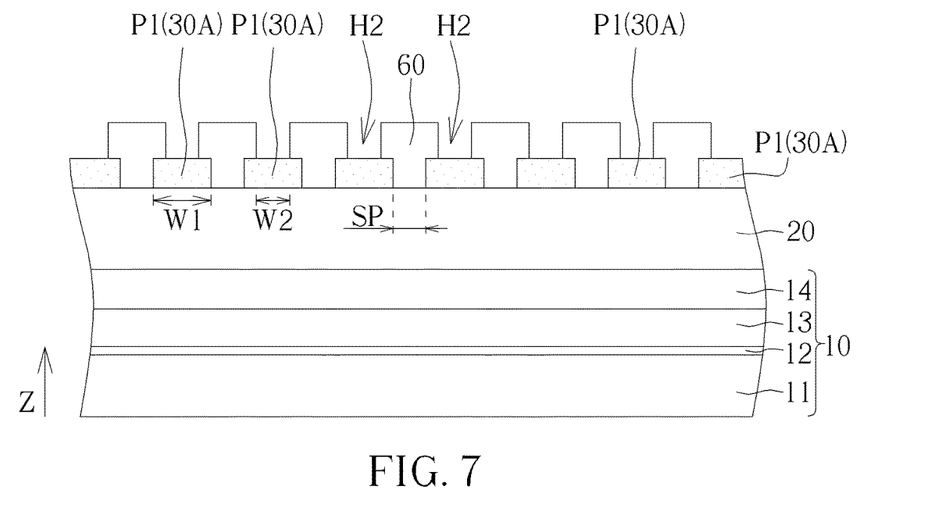
FIG. 7 is a schematic drawing in a step subsequent to FIG. 6.
Figure 8:
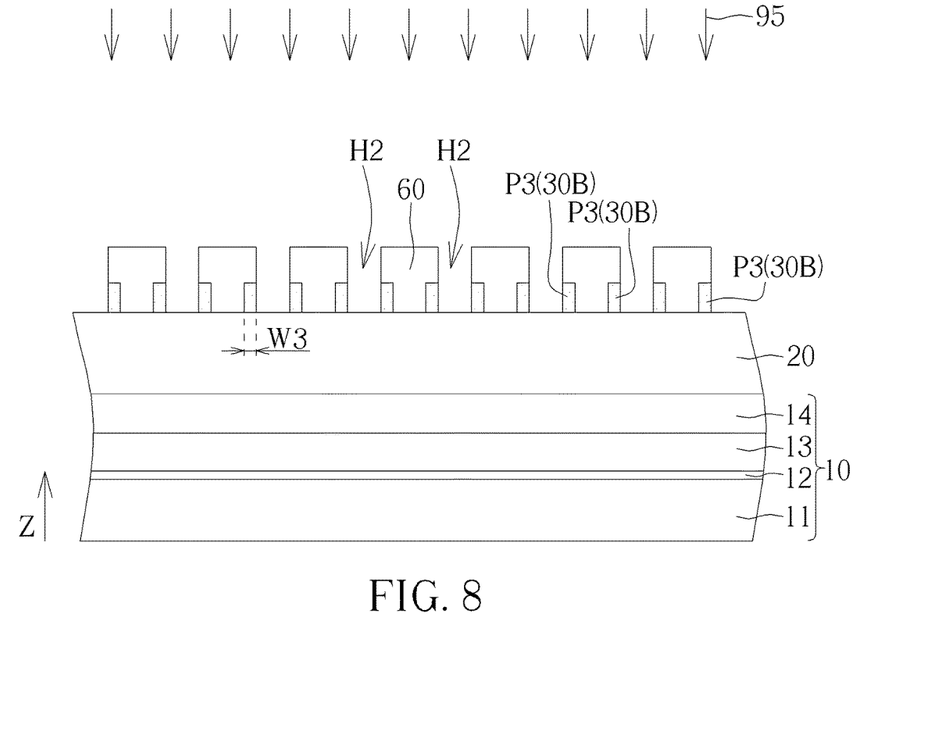
FIG. 8 is a schematic drawing in a step subsequent to FIG. 7.

As shown in FIG. 5 and FIG. 6, an etching back process 94 is then performed to the cover layer 60 for removing a part of the cover layer 60 and exposing a top surface of the second mask pattern 40A. Subsequently, as shown in FIG. 6 and FIG. 7, the second mask pattern 40A is removed for forming openings (such as second openings H2 shown in FIG. 7) in the cover layer 60. Each of the second openings H2 exposes a part of the first mask pattern 30A. As shown in FIGS. 6-8, the first mask pattern 30A is patterned using the cover layer 60 as a mask after the step of removing the second mask pattern 40A, and the first mask pattern 30A is patterned to be a third mask pattern 30B.

Specifically, each of the second openings H2 may be formed self-aligned on the corresponding first sub pattern P1 also because the second openings H2 in the cover layer 50 are formed by removing the second sub patterns P2 of the second mask pattern 40A, and each of the first sub patterns P1 may be partly exposed by the corresponding second opening H2 and partly covered by the cover layer 60. Therefore, an etching process 95 may be performed to the first mask pattern 30A with the cover layer 60 having the second openings H2 as an etching mask for removing the first mask pattern 30A exposed by the second openings H2 and forming the third mask pattern 30B including a plurality of third sub patterns P3. The etching process 95 is performed to the first mask pattern 30A after the step of forming the cover layer 60. The etching process 95 may be performed using the cover layer 60 as a mask after the step of removing the second mask pattern 40A, and the first mask pattern 30A is etched to be the third mask pattern 30B by the etching process 95.

Each of the first sub patterns P1 may be etched for forming two third sub patterns P3, and the width of each of the third sub patterns P3 (such as a third width W3 shown in FIG. 8) may be smaller than the width of the first sub pattern P1 accordingly. The third sub patterns P3 formed by the second openings H2 may have the same width substantially because the second openings H2 may be formed self-aligned on the corresponding first sub patterns P1. Additionally, in some embodiments, if the third sub patterns P3 are going to be aligned uniformly by the same spacing and the same pitch, a distance SP between two of the first sub patterns P1 adjacent to each other may be substantially equal to the second width W2 of each of the second sub patterns P2 after the first trim process described above, and the width of each of the second openings H2 may be substantially equal to the distance SP between two of the first sub patterns P1 adjacent to each other, but not limited thereto. In addition, the width of each of the third sub patterns P3 may be modified by the above-mentioned patterning process 91 in FIG. 2 and the above-mentioned plasma treatment 92 in FIG. 3 respectively, and the CD control of the patterning method may be improved.

Figure 9:
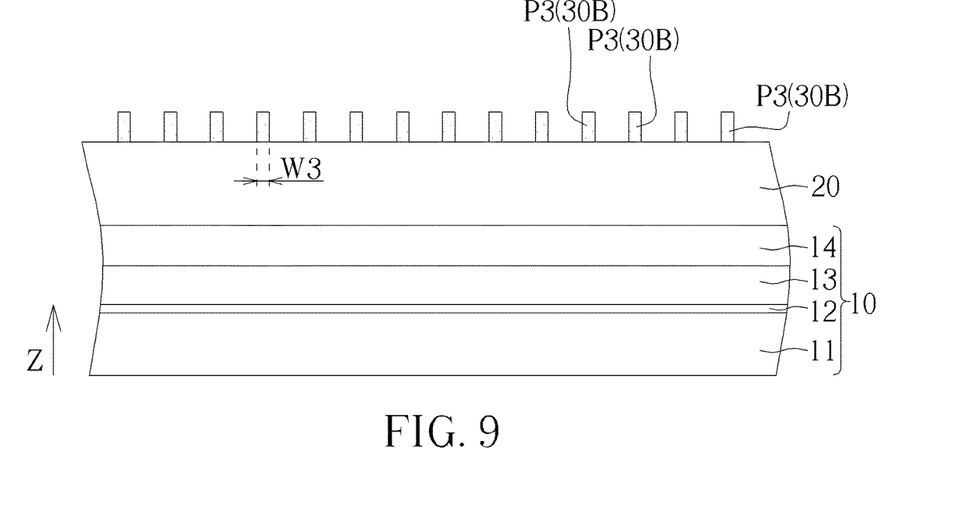
FIG. 9 is a schematic drawing in a step subsequent to FIG. 8.
Figure 10:
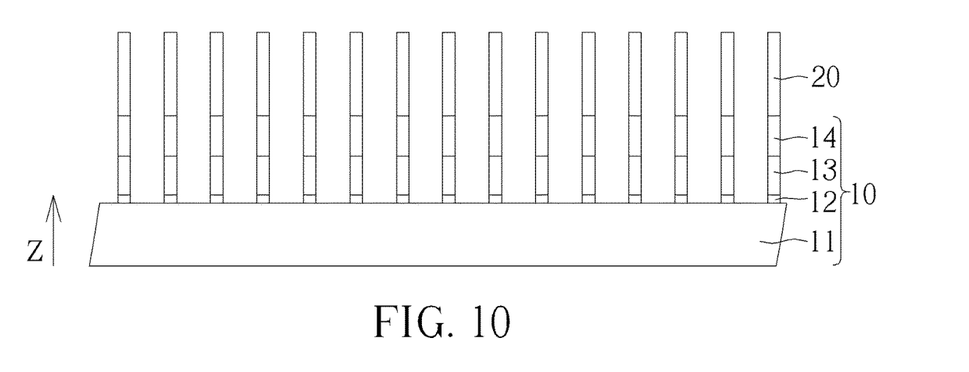
FIG. 10 is a schematic drawing in a step subsequent to FIG. 9.

As shown in FIGS. 8-10, after the etching process 95, the cover layer 60 may be removed, and the pattern of the third mask pattern 30B may be transferred to the cap layer 20 and the material layer 10. In some embodiments, an etching process may be used to transfer the pattern of the third mask pattern 30B to the cap layer 20 first, and the patterned cap layer 20 may be used as an etching mask for etching the material layer 10, but not limited thereto. Additionally, in some embodiments, the patterning method described above may be used to form bit line structures in a memory cell region of a semiconductor memory device, gate structures in a peripheral region of the semiconductor memory device, and/or other patterned structures in a semiconductor device, for example.

Additionally, it is worth noting that, as shown in FIG. 2, FIG. 8, and FIG. 9, there may be etching recesses on the surface of the cap layer 20 because of the influence of the processes performed before the step of transferring the pattern of the third mask pattern 30B to the cap layer 20 and the material layer 10. The performance of transferring the pattern of the third mask pattern 30B to the cap layer 20 and/or the material layer 10 may be affected by the etching recesses on the surface of the cap layer 20 between the third sub patterns P3 especially when the depths of the etching recesses are not uniform. However, the patterning method of the present invention may be used to control the process condition of the patterning process 91 shown in FIG. 2 and the process condition of the etching process 95 shown in FIG. 8, and the level of the etching recesses on the surface of the cap layer 20 may be uniform accordingly. Additionally, spacers formed for patterning in the conventional self-aligned double patterning (SADP) approach are not required in the patterning method of the present invention, and related problems cause by using the spacers for patterning (such as the spacer bending issue) may be avoided accordingly. Comparatively, the shape, the size, and the pitch of the third mask pattern 30 used for patterning in the present invention may be modified by the related processes (such as the patterning process 91 shown in FIG. 2, the plasma treatment 92 shown in FIG. 3, and the etching process 95 shown in FIG. 9), the pattern may be transferred more ideally, and the manufacturing yield and the operation performance of the device formed by the patterning method of the present invention may be improved.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 11:
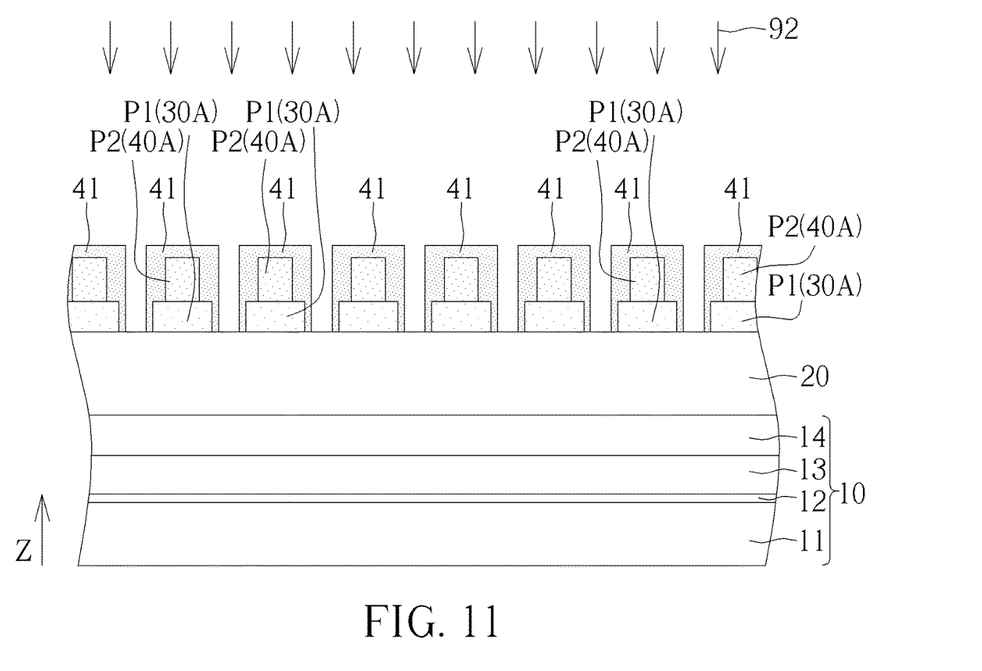
FIG. 11 is a schematic drawing illustrating a patterning method according to a second embodiment of the present invention.

Please refer to FIG. 2, FIG. 11, and FIG. 4. FIG. 11 is a schematic drawing illustrating a patterning method according to a second embodiment of the present invention. FIG. 11 may be regarded as a schematic drawing in a step subsequent to 2, and FIG. 4 may be regarded as a schematic drawing in a step subsequent to FIG. 11. As shown in FIG. 2, FIG. 11, and FIG. 4, the difference between the patterning method in this embodiment and the patterning method in the first embodiment is that the treated layer 41 in this embodiment may further cover a side surface of each of the first sub patterns P1. In some embodiments, the first sub patterns may be oxidized or hydrogenated by the plasma treatment 92 also, but the oxidation level or the hydrogenation level of the first sub patterns P1 may be lower than the oxidation level or the hydrogenation level of the second sub patterns P2. Therefore, the treated layer 41 on the side surfaces of the first sub patterns P1 may be formed by consuming a part of each of the first sub patterns P1, but not limited thereto. The CD of the first mask pattern 30A may be further shrunk by the approach described above, and that is beneficial for forming tinier patterned structures.

Figure 12:
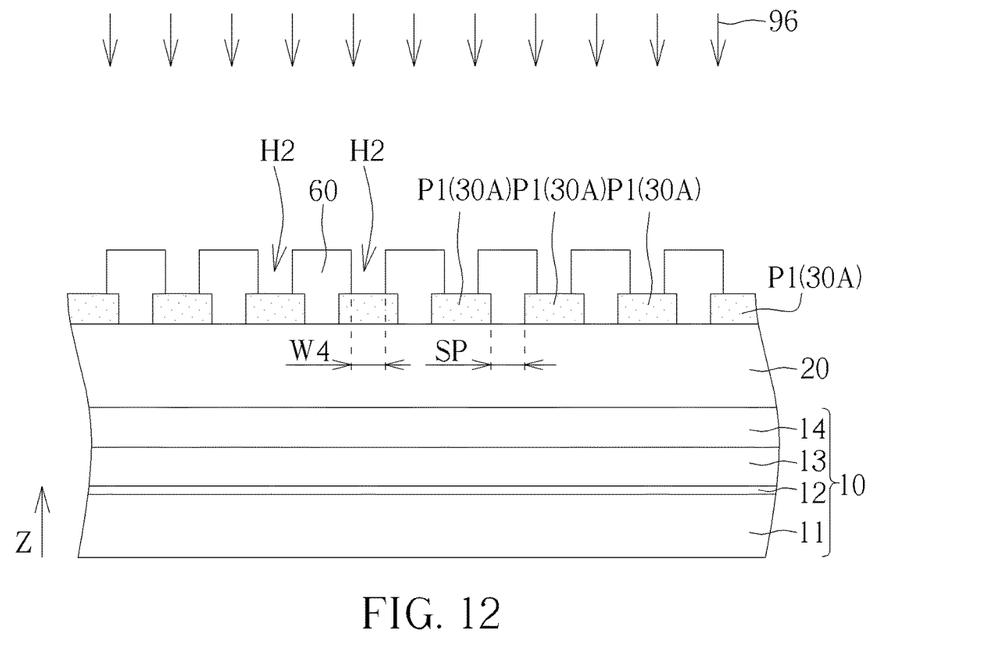
FIG. 12 is a schematic drawing illustrating a patterning method according to a third embodiment of the present invention.

Please refer to FIG. 6, FIG. 12, and FIG. 8. FIG. 12 is a schematic drawing illustrating a patterning method according to a third embodiment of the present invention. FIG. 12 may be regarded as a schematic drawing in a step subsequent to 6, and FIG. 8 may be regarded as a schematic drawing in a step subsequent to FIG. 12. As shown in FIG. 6, FIG. 12, and FIG. 8, the difference between the patterning method in this embodiment and the patterning method in the first embodiment is that the patterning method in this embodiment may further include performing a second trim process 96 to the cover layer 60 after the step of removing the second mask pattern 40A and before the etching process 95 for further modifying the size of the second openings H2 in the cover layer 60. For instance, the second trim process 96 may be performed to the cover layer 60 before the step of patterning the first mask pattern 30A for enlarging the size of the second openings H2 in the cover layer 60 when the width of each of the second sub patterns P2 in the second mask pattern 40A is too small. Therefore, the width of the second opening H2 in the cover layer 60 after the second trim process 96 (such as a fourth width W4 shown in FIG. 12) may be larger than the second width W2 of each of the second sub patterns P2, but not limited thereto.

To summarize the above descriptions, in the patterning method of the present invention, the plasma treatment may be performed to the second mask pattern so that the width of the second mask pattern becomes smaller than the width of the first mask pattern. The second mask pattern with the smaller width may be formed self-aligned on the first mask pattern, and the second mask pattern may be used for further patterning the first mask pattern and forming a pattern and a patterned structure with smaller CD. Additionally, the related problems cause by using the spacers for patterning in the conventional self-aligned double patterning may be avoided in the patterning method of the present invention. The etching recess loading control on the surface of the cap layer may be improved, and the size and the alignment pitch of the third mask pattern may be controlled more effectively by the patterning method of the present invention. The pattern may be transferred more ideally by the patterning method of the present invention, and the manufacturing yield and the operation performance of the device formed by the patterning method of the present invention may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A patterning method, comprising:
   forming a second mask layer on a first mask layer;
   performing a patterning process to the first mask layer and the second mask layer, wherein the first mask layer is patterned to be a first mask pattern, and the second mask layer is patterned to be a second mask pattern formed on the first mask pattern;
   performing a first trim process to the second mask pattern, wherein a width of the second mask pattern is smaller than a width of the first mask pattern after the first trim process;
   forming a cover layer covering the first mask pattern and the second mask pattern after the first trim process;
   performing an etching process to the first mask pattern after the step of forming the cover layer;
   removing a part of the cover layer for exposing the second mask pattern before the etching process;
   removing the second mask pattern before the etching process; and
   performing a second trim process to the cover layer after the step of removing the second mask pattern and before the etching process.

2. The patterning method according to claim 1, wherein the first trim process comprises:
   performing a plasma treatment to the second mask pattern, wherein a part of the second mask pattern is converted into a treated layer by the plasma treatment; and
   removing the treated layer after the plasma treatment.

3. The patterning method according to claim 2, wherein the plasma treatment comprises an oxidation treatment or a hydrogenation treatment.

4. The patterning method according to claim 3, wherein the part of the second mask pattern is oxidized or hydrogenated by the plasma treatment to be the treated layer.

5. The patterning method according to claim 3, wherein the oxidation treatment comprises a thermal oxidation treatment, and a process temperature of the oxidation treatment is higher than or equal to 250° C.

6. The patterning method according to claim 3, wherein an oxygen pressure used in the oxidation treatment is higher than or equal to 1 bar.

7. The patterning method according to claim 2, wherein the treated layer encompasses the second mask pattern.

8. The patterning method according to claim 2, wherein the first mask pattern comprises first sub patterns, and the treated layer covers a side surface of each of the first sub patterns.

9. The patterning method according to claim 8, wherein the treated layer on the side surfaces of the first sub patterns is formed by consuming a part of each of the first sub patterns.

10. The patterning method according to claim 1, wherein the second mask layer comprises a nitrogen doped silicon carbide layer.

11. The patterning method according to claim 1, wherein the width of the second mask pattern after the first trim process is smaller than the width of the second mask pattern before the first trim process.

12. The patterning method according to claim 1, wherein the width of the second mask pattern is equal to the width of the first mask pattern before the first trim process.

13. The patterning method according to claim 1, wherein the first mask pattern comprises first sub patterns, the second patterned mask comprises second sub patterns, and a distance between two of the first sub patterns adjacent to each other is equal to a width of each of the second sub patterns after the first trim process.

14. The patterning method according to claim 1, wherein the cover layer comprises a planarization layer, and space in the second mask pattern and the first mask pattern is filled with the cover layer.

15. The patterning method according to claim 1, wherein the second mask pattern is removed for forming openings in the cover layer, and each of the openings exposes a part of the first mask pattern.

16. The patterning method according to claim 15, wherein the etching process is performed using the cover layer as a mask after the step of removing the second mask pattern, and the first mask pattern is etched to be a third mask pattern.

17. The patterning method according to claim 16, wherein the first mask layer is formed on a material layer, and the patterning method further comprising:
 transferring the pattern of the third mask pattern to the material layer.

* * * * *